United States Patent [19]

Lifshitz et al.

[11] Patent Number: 5,149,672

[45] Date of Patent: Sep. 22, 1992

[54] PROCESS FOR FABRICATING INTEGRATED CIRCUITS HAVING SHALLOW JUNCTIONS

[76] Inventors: Nadia Lifshitz, 1591 Longhill Rd., Millington, N.J. 07946; Ronald J. Schutz, 14 Upper Warren Way, Warren, N.J. 07060

[21] Appl. No.: 754,361

[22] Filed: Aug. 29, 1991

Related U.S. Application Data

[63] Continuation of Ser. No. 617,464, Nov. 19, 1990, which is a continuation of Ser. No. 226,917, Aug. 1, 1988, abandoned.

[51] Int. Cl.$^5$ ............................................. H01L 21/44
[52] U.S. Cl. .................................... 437/189; 437/192; 437/190; 437/194; 148/DIG. 20
[58] Field of Search ............... 437/189, 192, 190, 194; 148/DIG. 20, DIG. 26

[56] References Cited

U.S. PATENT DOCUMENTS

| | | | |
|---|---|---|---|
| 3,887,993 | 6/1975 | Okada et al. | 437/160 |
| 4,486,946 | 12/1984 | Jopke, Jr. et al. | 437/177 |
| 4,597,167 | 7/1986 | Moriya et al. | 437/187 |
| 4,624,864 | 11/1986 | Hartmann | 437/193 |
| 4,845,050 | 7/1989 | Kim et al. | 437/192 |

FOREIGN PATENT DOCUMENTS

| | | | |
|---|---|---|---|
| 267730 | 5/1988 | European Pat. Off. | 437/192 |
| 0181571 | 10/1984 | Japan | 437/189 |
| 0219945 | 9/1987 | Japan | 437/192 |
| 2181456 | 4/1987 | United Kingdom . | |

OTHER PUBLICATIONS

N. E. Miller and I. Beinglass, *Solid State Technol.*, 25(12) 85 (1982).
E. K. Broadbent and C. L. Ramiller, *J. Electrochem. Soc.*, 131, 1427 (1984).
E. K. Broadbent and W. T. Stacy, *Solid State Technol.*, 49(12), 51 (1985).
M. L. Green and R. A. Levy, *Semicon East 1985 Technical Proceedings*, 57 (1985).
M. L. Green and R. A. Levy, *J. Electrochem. Soc.*, 132, 1243 (1985).
G. E. Georgiou, et al., *Tungsten and Other Refractory Metals for VLSI Applications II*, E. K. Broadbent, Editor, p. 225, MRS, Pittsburgh, Pa. (1987).
N. Lifshitz et al. *Tungsten and Other Refractory Metals for VLSI Applications III*, V. A. Wells, Editor, p. 225, MRS, Pittsburgh, Pa. 1988.
*VLSI Technology*, 2nd Edition, edited by S. M. Sze, McGraw-Hill, 1988, p. 364.
*Materials Research Society Symposia Proceedings*, 18, 89 (1982).
P. B. Ghate, et al, *Thin Solid Films*, 53, 117 (1978).
M. Maenpaa, et al, *Proceedings of the Symposium on Thin Film Interfaces and Interactions*, 80-2, 316 (1980).
M. L. Hammond, *Introduction to Chemical Vapor Deposition*, Solid State Technology, Dec. 1979, p. 61.
J. F. O'Hanlon, *A User's Guide to Vacuum Technology*, Wiley, New York, 1980, (Table of Contents).
*Handbook of Thin Film Technology*, S. M. Sze, ed. Maissel and Clang McGraw-Hill, New York, 1970.
Sze, supra, Chapters 4, 9.
Rana et al., "Thin layers of TiN and Al as glue layers for blanket tungsten deposition", 1987 Material Research Soc., pp. 187–195.
VLSI Science & Technology—1984, Proc. of 2nd Int. Symp. on VLSI Science and Technology May 6–11, 1984, Electrochem. Soc., Pennington, N.J., pp. 404–419.

*Primary Examiner*—Brian E. Hearn
*Assistant Examiner*—Tuan Nguyen

[57] ABSTRACT

For integrated circuit devices with strict design rules, junctions defining the source and drain are typically more shallow than 0.25 μm and are made through vias having an aspect ratio greater than 1.1. Suitable electrical contact to such a shallow junction is quite difficult. To ensure an appropriate contact, an adhesion barrier layer such as titanium nitride or an alloy of titanium and tungsten is first deposited. Tungsten is then deposited under conditions which produce a self-limiting effect in a prototypical deposition on silicon. Additionally, these tungsten deposition conditions are adjusted to higher rather than lower deposition temperatures. Subsequent deposition of aluminum if desired, completes the contact.

6 Claims, 1 Drawing Sheet

PROCESS FOR FABRICATING INTEGRATED CIRCUITS HAVING SHALLOW JUNCTIONS

This application is a continuation of application Ser. No. 07/617,464, filed on Nov. 19, 1990 which is a continuation of Ser. No. 07/226,917, filed Aug. 1, 1988 (now abandoned).

BACKGROUND OF THE INVENTION

1. Technical Field

This invention relates to integrated circuit manufacture and, in particular, manufacture of integrated circuits having shallow junctions.

2. Art Background

In the manufacture of integrated circuits, electrical contact to junctions such as the source and drain of field effect transistors is required. For these devices desirable electrical properties include a junction contact resistance less than 10 ohms and a junction leakage current less than $10^{-7}$ amps/cm$^2$. Complexities inherent in strict design rules make satisfaction of these requirements significantly more difficult. (The device design rule is the smallest lateral dimension for all features within the device circuit.) For example, since the source and drain junctions are typically no deeper than 0.25 $\mu$m at submicrons design rules, any undesirable chemical reaction with the junction induced by the fabrication process quickly destroys it. Additionally, electrical contact is made through an opening in an overlying dielectric to the underlying junction region, e.g., drain or source junction region. Typically, as a consequence of strict design rules, this opening (via) has a high aspect ratio, i.e., greater than 1.1. (Aspect ratio is defined as the thickness of the dielectric at the junction divided by the effective diameter of the via at the junction, i.e., the diameter of a circle having the same area as the via at the junction.) To contact the junction through a high aspect ratio opening requires deposition of a conductive material that conforms to or fills the opening so that the conducting cross-section in the via is adequate to maintain an acceptably low current density and contact resistance. Thus, in summary, to ensure a suitable contact, undesirable chemical reaction with the junction should be avoided while a coating that conforms to or fills the via should be produced.

Generally, it is desirable to utilize aluminum as the electrically conductive contact material because of its high conductivity, etchability, excellent adhesion to silicon oxide, and nominal cost. However, direct deposition of aluminum to produce a suitable coating in a via that has an aspect ratio greater than 1.1 has not been reported. Thus, the simplicity and desirable characteristics of direct aluminum deposition is not available.

Other contact materials have been investigated. For example, the deposition of tungsten by a low pressure chemical vapor deposition (LPCVD) technique has been reported. (See, for example, N. E. Miller and I. Beinglass, *Solid State Technol.*,25 (12), 85 (1982), E. K. Broadbent and C. L. Ramiller, *J. Electrochem. Soc.*, 131, 1427 (1984), and E. K. Broadbent and W. T. Stacy, *Solid State Technol.*, 49(12), 51 (1985). This technique has the advantage of allowing deposition into vias that have aspect ratios greater than 1.1. However, there is a substantial undesirable interaction between the junction (including a silicide overlying the silicon) and chemical entities introduced during deposition of the tungsten. (See, for example, M. L. Green and R. A. Levy, *Semi-con East* 1985 *Technical Proceedings*,57 (1985), M. L. Green and R. A. Levy, *J. Electrochem. Soc.*, 132, 1243 (1985), G. E. Georgiou et al, *Tungsten and Other Refractory Metals for VLSI Applications II*, E. K. Broadbent, Editor, page 225, MRS, Pittsburgh, PA, 1987, and N. Lifshitz et al, *Tungsten and Other Refractory Metals for VLSI Applications* III, V. A. Wells, Editor, page 225, MRS, Pittsburgh, PA, 1988.) Under certain conditions this interaction is self limiting. That is, the amount of junction silicon consumed during the deposition reaches a maximum value that depends on the reaction conditions. Despite this self-limiting effect, the damage produced is still too extensive for junctions, such as source and drain junctions, shallower than 0.25 $\mu$m. Additionally, the adhesion between the deposited tungsten material and the dielectric material, e.g., silicon dioxide, is not entirely desirable. Thus, although tungsten under appropriate conditions produces a conformal coating, this coating still produces a device with unacceptable characteristics.

SUMMARY OF THE INVENTION

It is possible through the use of specific expedients to utilize a deposition of tungsten from tungsten hexafluoride to form an acceptable shallow junction contact through a high aspect ratio via. In particular, before tungsten deposition a layer that promotes adhesion between tungsten and silicon dioxide should be deposited. Suitable layers include titanium nitride and alloys of titanium and tungsten. These layers are perceived as barriers to diffusion of tungsten entities. Nevertheless, unless the subsequent tungsten deposition using tungsten hexafluoride is done under appropriate conditions, suitable electrical properties are not obtained.

A self-limiting reaction during deposition from tungsten hexafluoride is required despite the presence of a material considered a barrier to tungsten diffusion. Even more surprisingly, appropriate conditions for tungsten deposition are discernible utilizing a controlled experiment involving silicon without such a barrier layer, and improved yield is generally obtained at higher, rather than the expected lower, deposition temperatures.

Appropriate conditions for tungsten deposition are determined by reference to results achieved when deposition is done directly on a prototypical silicon substrate implanted with the same total dose used in the device ultimately to be manufactured. The deposition for producing the desired contact to a shallow junction is performed under conditions that produce a suitable self-limiting effect when deposition is induced on a silicon substrate. The tungsten deposition further 1) should be performed in a temperature range between 250° C. and 600° C. and 2) in this range an appropriate temperature should preferably be determined by noting the self-limiting thickness as deposition temperatures increase.

After a suitable tungsten deposition has been performed, it is possible, if desired, to increase the thickness of the metallization by depositing an overlying metal, such as aluminum directly on all the deposited material or onto the deposited material remaining after removal of tungsten on lateral surfaces. The combination of an adhesion layer, a tungsten layer deposited under appropriate conditions, and, if desired, an overlying metal layer, such as aluminum, produces juctions having a contact resistance less than 10 ohms, and a junction leakage current less than $10^{-7}$ amps/cm$^2$.

DETAILED DESCRIPTION

The processing of integrated circuits has been extensively discussed in the literature. Suitable conditions for producing structures having shallow junctions, i.e., junctions shallower than 0.25 μm, with overlying dielectric regions are discussed, for example, in *VLSI Technology*, 2nd Edition, edited by S. M. Sze, McGraw-Hill, 1988, page 364. Conventional methods are suitable for making the via through the overlying dielectric region. Generally, techniques such as reactive ion etching or plasma etching are utilized. The inventive process is useful for making contact through a via having an aspect ratio greater than 1.1 to any shallow junction including transistor source and drain—structures typically including a silicide region overlying a silicon region.

A layer is first deposited to ensure adequate adhesion between subsequently deposited layers and the dielectric. For dielectrics such as a silicon oxide, e.g., silicon dioxide, an appropriate adhesion layer includes compositions previously believed to be barriers to diffusion of tungsten entities. These compositions encompass materials such as titanium nitride or titanium/tungsten alloys. Conventional methods of depositing these layers are acceptable. Typically, processes such as magnetron sputtering for titanium nitride and for tungsten/titanium alloys as described in *Materials Research Society Symposia Proceedings*, 18, 89 (1982) and by P. B. Ghate et al, *Thin Solid Films*, 53, 117 (1978) respectively are useful. Generally, the adhesion layer should have a thickness (measured on large lateral device surfaces) in the range 100 to 1500 Å. Layers thinner than 100 Å are not desirable because they lack reliable continuity, while thicknesses greater than 1500 Å are not desirable because they unacceptably complicate subsequent processing such as etching. The composition and structure of suitable titanium nitride or titanium/tungsten alloys are extensively described in papers such as M. Maenpaa et al, *Proceedings of the Symposium on Thin Film Interfaces and Interactions*, 80-2, 316 (1980).

Tungsten is then deposited by LPCVD using a precursor composition including tungsten hexafluoride and a reducing agent such as hydrogen. The conditions utilized for this deposition are important. Generally, the deposition substrate should be heated to temperatures in the range 250° C. to 600° C. Temperatures less than 250° C. lead to inadequate deposition rates while temperatures greater than 600° C. lead to undesirable interdiffusions in the structure being formed and/or in other device structures present on the wafer being processed.

Figure 1:
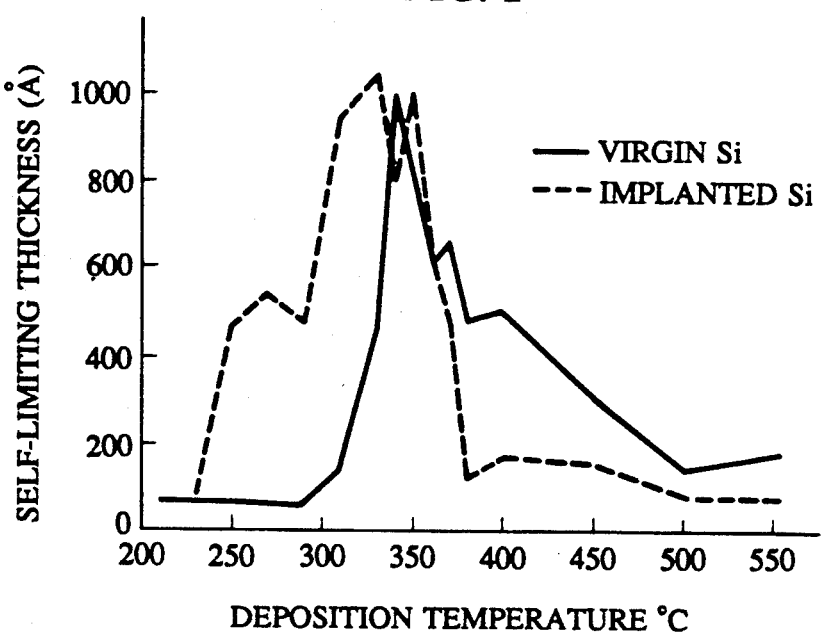
FIGS. 1 and 2 illustrate properties involved in the invention.

The precise conditions suitable for the tungsten deposition vary with reactor design. Appropriate conditions are determined by performing a control sample in the desired deposition apparatus utilizing 1) a precursor composition including only tungsten hexafluoride and argon and 2) a bare silicon prototype wafer that has been subjected to an implant dose equivalent to the total implant dose that is ultimately to be employed in the device. Conditions should be chosen such that a self-limiting effect with a self-limiting thickness smaller than the junction thickness is achieved on the silicon prototype wafer in the 250° C. to 600° C. temperature range. (The self-limiting effect is characterized by a tungsten formation rate at 10 minutes that is less than 10% of the initial equilibrium rate. The self-limiting thickness is the tungsten thickness under these conditions achieved at 10 minutes.) For example, when a hot wall, e.g., tube reactor (see, M. L. Hammond, *Introduction to Chemical Vapor Deposition*, Solid State Technology, Dec. 1979, p. 61), is employed with tungsten hexafluoride and argon, the self-limiting thickness vs. temperature is shown in FIG. 1. Similarly, when a cold wall reactor (see, Hammond Supra) is utilized in the temperature range 250° C. to 600° C. no self-limiting effect is observed and thus under these conditions this reactor should not be employed. (A proposed mechanism for this phenomenon is that the presence of hot elemental tungsten induces the desired self limitation. The self-limiting effect does not occur in the absence of hot (above 400° C.) tungsten, e.g., where in-situ generation of tungsten does not occur or where hot elemental tungsten is not otherwise introduced. Indeed, the presence of a substantial amount of elemental tungsten on the wafer before deposition decreases the self-limiting thickness.)

Within the desired temperature range generally one extremum in self limiting thickness is observed. Beyond the extremum the higher the temperature, typically, the smaller the self-limiting thickness. This is contrary to what typically would be expected from general trends of increased reactivity and diffusion with higher temperatures. A temperature should be chosen so that the self-limiting thickness is less than the junction depth and so that the deposition rate is adequate. Typically, beyond this junction thickness limit, the thinner the self-limiting thickness the higher the device yield. The temperature should preferably be chosen such that the device yield of working test junctions decreases no more than 10% compared to the yield obtained for the same junction having a via aspect ratio of 0.75 and with a contact of only aluminum. (A test junction is an identical structure to the junction being contacted in the device but with no surrounding device structures and with suitable leads or contact pads for making electrical measurements.) If a range of temperatures yields approximately the same self-limiting thickness on the prototype wafer, the lowest of these temperatures should preferably be employed for device fabrication since lower temperature processing is generally preferred. However, temperatures below the self-limiting thickness extremum (and above 250° C.) although no precluded yield slower deposition and are not preferred.

The determination of suitable temperatures for a given deposition procedure is exemplified in FIG. 1. To increase yield, it is desirable to perform the inventive fabrication processes at temperatures of approximately 425° C. where the self-limiting thickness is at a relatively minimum value. Since the self-limiting thickness does not decrease significantly, in this example, above 425° C. and since for processing reasons unrelated to self-limiting thickness it is generally desirable to deposit at lower temperatures, 425° C. is a preferred temperature for this example.

In one embodiment, deposition of tungsten is performed in a hot wall reactor utilizing a gas composition including a tungsten hexafluoride flow in the range 40 to 200 sccm and a reducing gas, e.g., hydrogen flow, in the range 500 to 2000 sccm with a total pressure in the range 0.2 to 1 Torr. (The addition of other gases is not precluded.) The thickness of the deposited tungsten should typically be in the range from 2000 Å to 0.6 times the via effective diameter. Thicknesses less than 2000 Å yield unacceptably high contact resistance or current densities while thicknesses greater than 0.6 times the via effective diameter lead to difficulties in subsequent processing. In any case, the maximum thickness of the final metallized region should not be greater than the minimum lateral dimension of a metallized region in the device.

It is possible, if desired, to deposit a further metallic material. It has been found advantageous to utilize aluminum as this material. Aluminum deposition such as magnetron sputtering described in J. F. O'Hanlon, *A User's Guide to Vacuum Technology*, Wiley, N.Y., 1980 and *Handbook of Thin Film Technology*, S. M. Sze, ed. Maissel and Glang, McGraw-Hill, New York, 1970 is typically employed. Total metal thickness should not exceed the limit discussed above. The final metallic contact is then patterned to produce the desired device configuration by conventional lithographic processes such as described in Sze, supra, Chapter 4.

The following examples are illustrative of conditions useful in the inventive process.

EXAMPLE 1

Sixteen wafers having a 3500 Å thick thermal $SiO_2$ dielectric with vias of various sizes were processed. The active junctions were first formed on the wafers by depositing 300 Å of cobalt using a sputtering process as described in Sze, supra, Chapter 9. The cobalt was sintered at 450° C. for 90 minutes to form cobalt monosilicide in the vias. Elemental cobalt present on the $SiO_2$ was selectively removed by immersing the wafer in a 16:1:1:2 by volume mixture of phosphoric acid, nitric acid, glacial acetic acid and dionized water. This monosilicide was implanted with arsenic using an ion implanter with a 100 KeV acceleration voltage and a total dose of $5 \times 10^{15}$ cm$^{-2}$. Cobalt disilicide was formed by annealing the wafers at 700° C. in argon for 30 minutes. (For another description of this process see Hillenius et al., Abstract 10-5, IEDM 1986.) The implanted arsenic was then driven into the silicon substrate at 800° C. for 120 minutes in hydrogen. Subsequently, a 1 μm thick silicon dioxide layer was deposited by LPCVD in a tetraethoxysilane environment. The conditions utilized for this deposition were a deposition substrate temperature of 730° C. and gas flow of 480 SCCM of $N_2$ together with the vapor pumped from over liquid TEOS to yield a total chamber pressure of 580 mTorr. Holes having various aspect ratios ranging from 1.25 to 0.2 were then formed through the silicon dioxide to the underlying cobalt silicide using standard lithographic techniques and a reactive ion etching procedure. Approximately 1000 Å of titanium nitride was deposited on the wafers by the magnetron sputtering. This procedure was performed with 1) a substrate temperature of 80° C., 2) RF voltage of 150 V and a DC power of 2 KW and 3) a 10:1 by volume flow of Ar and $N_2$ yielding a total pressure of $2.2 \times 10^{-2}$ Torr.

The 16 wafers were positioned in the deposition boat, of a hot wall reactor. The boat had provision for holding 40 parallel wafers in a vertical plane. The wafers being processed were positioned in slots number 5 through 21 spaced approximately 1 cm apart and the remaining spaces were occupied with unprocessed silicon wafers having a tungsten coating. A nitrogen flow of 1000 sccm was established in a reactor heated to 300° C. and the boat was put in the deposition position. The nitrogen flow was discontinued and the reactor was evacuated to a pressure of approximately 15 mTorr. The reactor was then brought to a temperature of 325° C. and maintained at this temperature for 15 minutes for thermal stabilization. A flow of 100 sccm of $WF_6$ and 1000 sccm of hydrogen was introduced to produce a total pressure of 0.2 Torr. This flow was then continued until between 1000 and 2000 Å were deposited on the wafers being processed. After the first deposition, the placement of the wafers in positions 5 through 21 were reversed under nitrogen and a second deposition of tungsten was initiated under the same deposition conditions as the first tungsten deposition. Deposition was continued until the total deposited tungsten thickness was approximately 2500 Å. (The reversal of wafers was done to average any thickness nonuniformities due to the loading effect. Final thicknesses varied no more than 5% between wafers.) The total deposition time was approximately 40 minutes.

Figure 2:
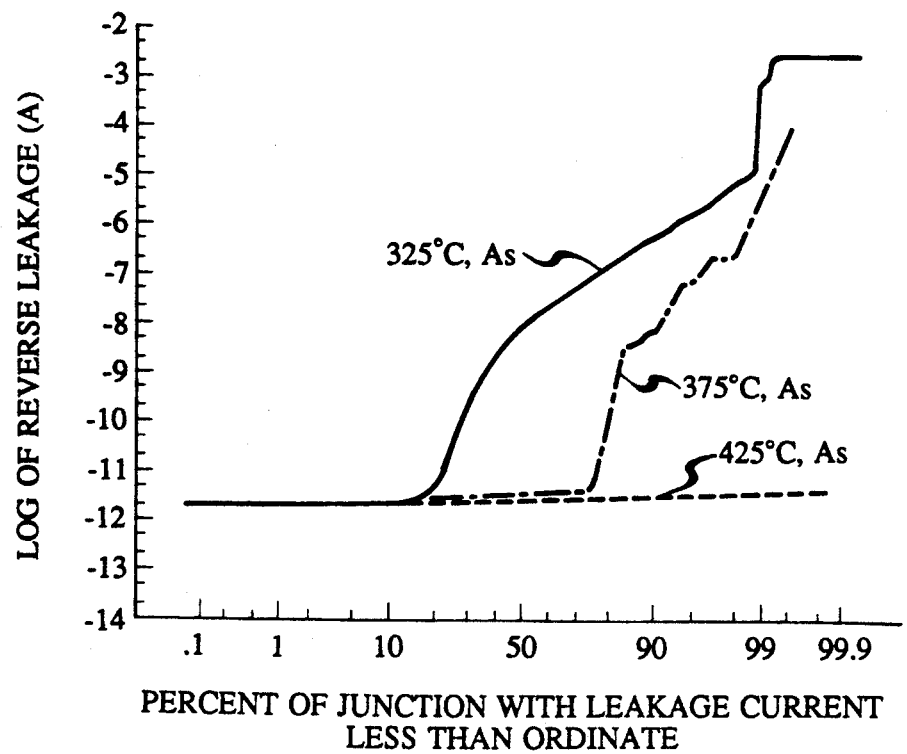

Approximately 1 micron of aluminum was magnetron sputtered onto the wafers using an initial cleaning by inducing backsputtering in an RF plasma and then magnetron sputtering in 7 mTorr of Ar at room temperature. The deposited aluminum was then annealed in a tube furnace at 450° C. using a hydrogen ambient. This aluminum layer was patterned to make electrical connections suitable for testing the junctions. The properties of the resulting p-n junctions were measured by applying a reverse bias of 3.5 volts on the device array. (Each wafer had 98 devices with a device occupying an area of approximately 5 μm on a side.) The electrical properties were measured with a Keithley Model 617 Electrometer and Programmable Voltage Source through an automatic wafer probe. Reverse voltage was applied for 5 seconds on each device and 10 readings of the current were taken in rapid succession. The average value was then recorded. The statistical distribution of the measured leakage current is shown in FIG. 2.

EXAMPLE 2

The same procedure as described in Example 1 was followed except the deposition took a total of 32 minutes and was performed at 375° C. The resulting electrical properties are shown in FIG. 2.

EXAMPLE 3

The procedure of Example 1 was followed except a total deposition time of 28 minutes at a temperature of 425° C. was utilized. The resulting electrical properties are shown in FIG. 2.

We claim:

1. A process for fabricating a semiconductor device comprising the steps of treating a substrate by forming a passage through a region overlying a device junction, depositing a material over at least a portion of said region to form an electrical contact to said junction together with an electrical conducting region on the surface of said overlying region and progressing towards completing said device, characterized in that said passage has an aspect ratio of at least 1.1, said junction has a depth shallower than 2500 Å, and said electrical contact and said conductive region on said surface comprises a deposition of 1) a material that presents a barrier to the solid-state diffusion of tungsten and 2) deposition of tungsten by interaction of said substrate with a deposition comprising $WF_6$ entities and a reducing agent wherein said substrate is heated to a deposition temperature in the range 250° C. to 600° C. during said tungsten deposition wherein said deposition temperature and environment is controlled such that said interaction is self-limiting with a self-limiting thickness less than said junction depth and wherein said deposition temperature is chosen such that the yield of said junctions decrease not more than 10% compared to the yield obtained for the same function having a via aspect ratio of 0.75 and having a contact of only aluminum.

2. The process of claim 1 wherein said reducing agent comprises hydrogen.

3. The process of claim 2 wherein said diffusion barrier comprises titanium nitride.

4. The process of claim 2 wherein said diffusion barrier comprises a titanium/tungsten alloy.

5. The process of claim 1 wherein said diffusion barrier comprises titanium nitride.

6. The process of claim 1 wherein said diffusion barrier comprises a titanium/tungsten alloy.

* * * * *